DATA PROCESSING APPARATUS

Filed Jan. 2, 1962 3 Sheets-Sheet 1

INVENTOR.
KENNETH R. SHARPLES
BY Weingarten,
Orenbuch, & Pandiscio
ATTORNEYS

INVENTOR.
KENNETH R. SHARPLES
BY
Weingarten, Orenbuch, & Pandiscio
ATTORNEYS

June 7, 1966 K. R. SHARPLES 3,255,447

DATA PROCESSING APPARATUS

Filed Jan. 2, 1962 3 Sheets-Sheet 3

INVENTOR.
KENNETH R. SHARPLES
BY
*Weingarten, Orenbuch, & Pandiscio*
ATTORNEYS

United States Patent Office

3,255,447

Patented June 7, 1966

3,255,447

DATA PROCESSING APPARATUS

Kenneth R. Sharples, South Braintree, Mass., assignor to Epsco Incorporated, Cambridge, Mass., a corporation of Massachusetts Filed Jan. 2, 1962, Ser. No. 163,799
10 Claims. (Cl. 340—347)

This invention relates to an analog-to-digital converter and more particularly pertains to an electronic device for rapidly converting an analog input signal to output signals having a digital value corresponding to the analog value of the input signal.

An analog-to-digital converter is a mechanism which responds to the impress at its input of a signal (the analog signal) representing the instantaneous value of a variable quantity by translating that value into an equivalent numerical form. In general, an electronic converter of this type periodically samples the amplitude of the analog signal and converts the amplitude of each sample to a corresponding set of digital signals having a numeric value, i.e., a count, equal to the value of the related analog sample.

Several general types of electronic analog-to-digital converters are known, some of which have achieved widespread use. In one type of converter, a ramp voltage is generated and is compared with the voltage of the analog input signal. A gate controlled by the comparator opens when the ramp voltage equals the analog voltage and closes when the ramp voltage attains some fixed reference potential, e.g., ground potential. A pulse generator supplies clock pulses to the gate, and during the time the gate is open, the clock pulses are permitted to pass into a counter which sums the number of clock pulses passed by the gate. When the gate closes, clock pulses are prevented from passing to the counter. In essence, the amplitude of the analog signal is converted into a gating signal whose duration is related directly to the analog amplitude and by counting the number of clock pulses generated during that interval, the measure of the analog signal's amplitude is obtained in digital form. Such a converter may be termed a "clock counting" converter. Relative to the other converter types, the clock counting converter is slow in operation because each conversion cycle must be of such duration as to accommodate the largest amplitude analog signal which the converter is intended to accommodate.

A second type of analog-to-digital converter is known as a "direct" converter because it measures the amplitude of the analog signal and produces the corresponding digital value directly, viz., without intermediate operations such as counting or gating for a time interval. In one form of direct converter, a cathode ray tube, of special construction, is provided with apparatus for deflecting the electron beam. The input analog signal causes the beam to be deflected to a particular one of a plurality of aperture rows, the aperture rows being arranged in accordance with the digital code into which the analog signals are to be converted. After being deflected to the selected row, the beam is swept along the row to obtain the digital code. The direct type of converter is capable of operating at very high speeds but requires special cathode ray tubes and very critical stabilizing circuits.

A third type of analog-to-digital converter has its operation based upon the comparison of the input analog signal with a locally generated signal of the same kind, the locally generated signal being altered by a control circuit until the compared signals are equal. The state of the local signal generator at the time the compared signals are equal, is then read out in digital form. Within this third category of analog-to-digital converter is the "continuous" converter. In the continuous converter, the amplitude of the analog signal is continually sampled and each sample is compared with a locally generated reference voltage related directly to the converter's output digital count which is obtained from a digital counter in the converter. If there is a difference between the sampled voltage and the reference voltage, the comparison causes a signal to be produced, indicating the sense of the difference; that is, where the voltage of the sample is greater than the reference voltage, one type of signal is produced, whereas if the voltage of the sample is less than the reference voltage, a different signal is produced. The signal indicating the sense of the difference is used to change the sum in the counter by a fixed amount (e.g., one digit) in a direction dictated by the sense of the difference signal. The changed sum results in the reference voltage changing by a corresponding discrete voltage step. Each comparison causes the locally generated reference voltage to change by a discrete step until the reference voltage is equal, or very nearly equal to the analog voltage. After attaining that condition, the reference voltage closely and continually follows variations of the analog signal as the time required to convert an analog sample to a digital count is very short because the counter need change only one or two digits for each conversion.

Also coming within the third category of converters is the successive approximation analog-to-digital converter. In the successive approximation converter, the conversion from analog value to digital code is performed by a sequence of steps. Each step leads to a decision regarding a binary digit and the conversion to digital code occurs in descending order of digital significance. The successive approximation converter utilizes a series of gates, each gate being arranged to supply a reference voltage having a specific digital significance. In operation, the analog input signal is first compared with the reference voltage having the most digital significance. A comparator decides whether or not the analog voltage exceeds the reference voltage. Where the analog voltage is equal to or larger than the reference voltage, the gate controlling that reference voltage is left open. However, if the analog voltage is less than the reference voltage, the gate is closed causing the reference voltage to be removed from the comparator. The process of combining the various reference voltages and comparing each combination with the analog voltage is somewhat like the procedure for determining the weight of an object by a beam balance having two pans suspended from the ends of the beam. The object to be weighed is placed in one pan and the weights are placed on the other pan. The heaviest weight is used first and the progressively lighter weights are added one at a time. Where a weight is found to overbalance the beam, it is taken off the pan and the next lighter weight is tried. Where the added weight does not overbalance the beam, it is permitted to remain in the pan and another weight is added. By this procedure, the weight of the object is successively approximated as each weight is tried on the other pan. At the end of the procedure, the total of the weights remaining in the pan is the closest approximation to the weight of the object. In an analogous procedure, the successive approximation analog-to-digital converter utilizes reference voltages of different digital weights and the reference voltages are combined to approximate the voltage of the analog signal.

The present invention pertains to an analog-to-digital converter whose operation is based upon the generation of a local signal. The locally generated signal and the analog signal are both applied to the input summing junction of a high gain amplifier. Comparator devices coupled to the output of the amplifier cause the local signal to be altered until a virtual ground is established at the amplifier's summing junction. Each comparator device resides in one or the other of two stable states, the state of a particular comparator device depending upon the magnitude of the amplifier's output relative to a digitally weighted reference voltage. In one state, the comparator device causes a signal to be transmitted to the summing junction of the amplifier which tends to maintain that junction at virtual ground. The signals contributed by the comparaor devices are additive and their total brings the summing junction to virtual ground. When the condition of virtual ground is attained, the state of the comparator devices is then read out in digital form to obtain the digitized value of the analog signal.

The organization, construction, and mode of operation of the invention can be apprehended by a perusal of the following detailed exposition which is to be considered in conjunction with the accompanying drawings in which.

Figure 1:
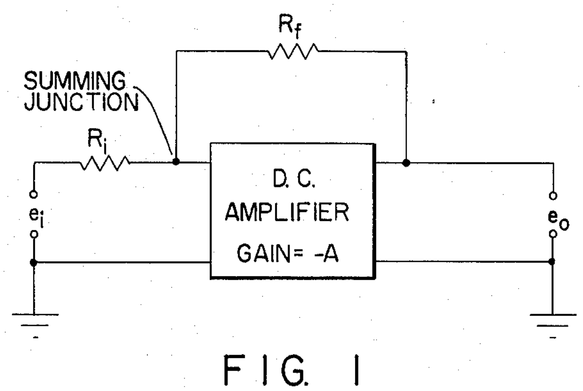
FIGS. 1 and 2 are symbolic representatives of an operational amplifier.

The basic mode of operation of the invention can be more easily apprehended by first considering the "operational amplifier" shown symbolically in FIG. 1. An operational amplifier is characterized by a feedback path causing a "virtual ground" to exist at the amplifier's input. The concept of an amplifier having a feedback path causing a virtual ground to exist at its input is of high importance to an understanding of the manner in which the invention operates. The D.C. amplifier of FIG. 1 has a gain $-A$, the negative sign signifying that the output signal $e_o$ is inverted in polarity relative to the polarity of the input signal $e_i$. Assuming the D.C. amplifier's gain to be infinite, an input signal $e_i$ applied to input resistor $R_i$ will cause an infinitely large voltage $e_o$ to appear at the amplifier's output. An infinitely large current, therefore, will flow through the feedback resistor $R_f$ in the direction determined by the polarities of $e_i$ and $e_o$. Assuming $e_i$ to be negative with respect to ground, $e_o$ is positive and an infinite current flows from the amplifier's output through $R_f$ toward the summing junction. If an infinite current flows in response to a small change in voltage of the input signal, the effective resistance at the amplifier's input, that is, at the summing junction must be zero. The summing junction, then, is said to be a "virtual" ground because it behaves as though it were actually short circuited to ground, the term "virtual" implying that no current actually flows through the short circuit but rather that the feedback through resistor $R_f$ serves to keep the voltage at the summing junction at zero. A "virtual" ground exists when the current through resistor $R_f$ equals the current flowing in resistor $R_i$.

In a practical device the gain of the amplifier is not truly infinite, but is generally sufficiently high to insure that the error introduced by the finite gain is negligible compared with the errors caused by other components such as the resistors $R_i$ and $R_f$. Ideally, the output voltage of the "operational" amplifier is an exact, though inverted, amplified image of the input signal voltage.

Figure 2:
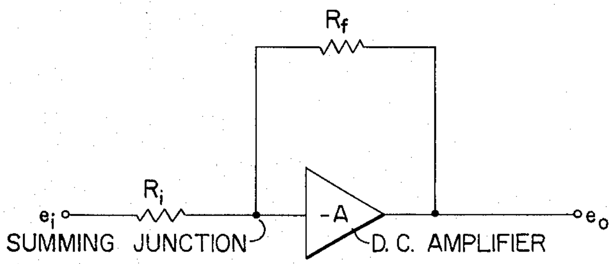

FIG. 2 is the conventional symbol for an "operational" amplifier and is equivalent to the symbolic diagram of FIG. 1.

Figure 3:
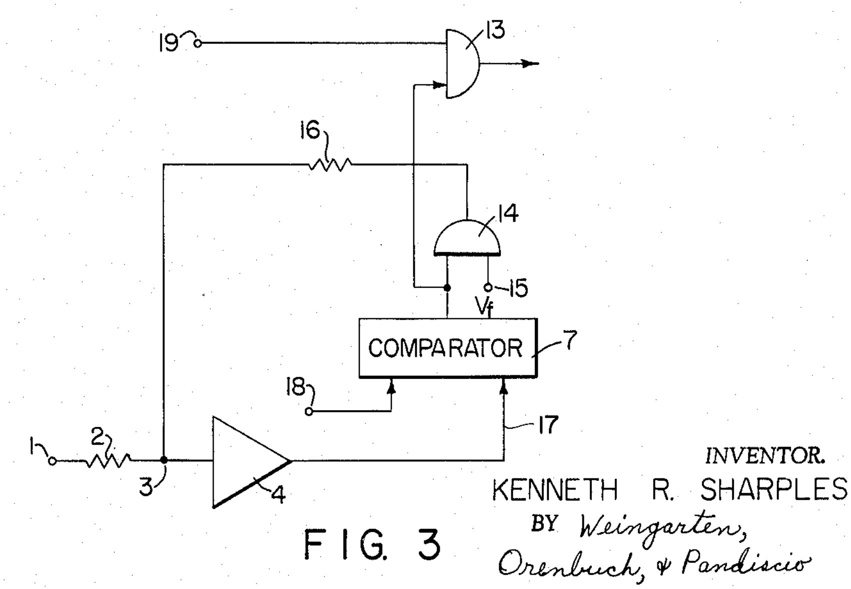
FIG. 3 depicts a simple analog-to-digital converter employing some basic principles of the present invention.

Consider now the simple analog-to-digital converter schematically depicted in FIG. 3. That simple converter embodies some basic principles of the present invention. An input analog signal, impressed at terminal 1, is applied through resistor 2 to the summing junction 3 of high gain D.C. amplifier 4. The output of amplifier 4 is applied to voltage comparator 7 where the amplifier's output voltage is measured against a reference voltage. Comparator 7 obtains its reference from the voltage applied at terminal 18. When the amplifier's output voltage exceeds the reference voltage applied to comparator 7, the comparator emits an enabling signal to AND gates 13, 14. Upon being enabled, AND gate 14 permits the signal impressed at its terminal 15 to be transmitted through that gate. The output of AND gate 14 is coupled by resistor 16 to summing junction 3. A constant voltage $V_f$, whose polarity is opposite to the polarity of the signal impressed at terminal 11, is applied at terminal 15 and resistor 16 is of such value that the signal fed back to summing junction 3 degenerates the signal applied through resistor 2 and tends to maintain a virtual ground at the input to amplifier 4.

It can be discerned from FIG. 3 that the depicted arrangement differs from the conventional operational amplifier in that the output of amplifier 4 is not fed back to the summing junction but rather the signal fed through resistor 16 to summing junction 3 is obtained from the output of gate 14. The amplifier 4, therefore, need not be a signal inverting device. It is necessary however, that the voltage $V_f$ be of a polarity opposite to the polarity of the signal applied at terminal 1.

Whenever gate 14 is enabled, its output is the voltage $V_f$. Resistor 16 has a fixed value of resistance and since the voltage $V_f$ is constant, the magnitude of the signal fed through that resistor to the summing junction is fixed if that junction is maintained at virtual ground. For any one value of voltage impressed at terminal 1, the value of resistor 16 can be chosen to cause the signal fed through it to maintain the junction 3 at virtual ground. For example, where the voltage impressed at terminal 1 is eight volts, the output of amplifier 4 is great enough in comparison to the voltage at terminal 18 to cause comparator 7 to enable gate 14. Upon being enabled, voltage $V_f$ appears at the output of gate 14 and causes a current to flow in resistor 16. The value of resistor 16 is chosen so that the current flowing through it equals the current flowing through resistor 2. That condition, establishes a virtual ground at summing junction 3. The arrangement of FIG. 3 is a means of determining whether the signal impressed at terminal 1 is less than or greater than a comparison voltage, in this instance, eight volts. If less than eight volts, the output of amplifier 4 compared to the voltage at terminal 18 is insufficient to cause the comparator to provide an enabling output to gate 14. If eight volts or more, the output of amplifier 4 compared to the voltage at terminal 18 is sufficient to cause the comparator to enable gate 14. The state of the comparator's output can be ascertained by ascertaining the condition of AND gate 13 which is enabled whenever gate 14 is enabled. When a readout pulse is applied at terminal 19, gate 13 provides an output if enabled but provides no output if inhibited. In the parlance of binary arithmetic, the presence of an output at gate 13 may arbitrarily be termed a ONE. The absence of an output at gate 13, therefore, then becomes a ZERO.

Figure 4:
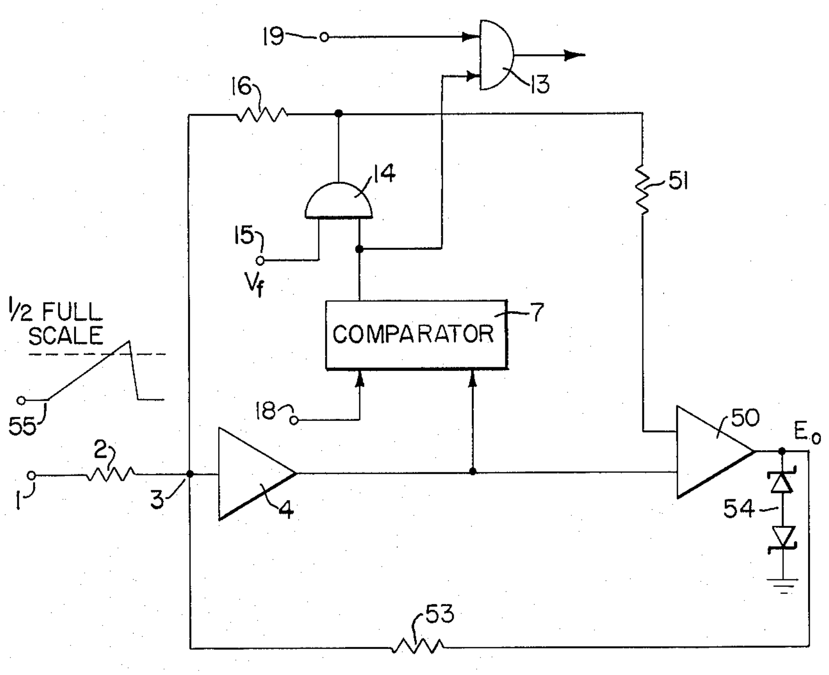
FIG. 4 illustrates a rudimentary analog-to-digital converter employing the principles of the present invention.

A somewhat more complex, but still rudimentary, analog-to-digital converter embodying the principles of the present invention is shown in FIG. 4. This embodiment differs from the arrangement of FIG. 3, inter alia, in that the output of amplifier 4 is fed into one input of a differential amplifier 50 having a gain approximately equal to unity. Either one of the amplifiers, but not both, must function to invert the polarity of its input signal. In this instance it is assumed that amplifier 4 is non-inverting and amplifier 50 acts to invert its input signal. The other input of differential amplifier 50 is coupled by resistor 51 to the output of gate 14 so that when that gate is enabled, the voltage $V_f$ at terminal 15 is connected to resistor 51. Gate 14 is constructed so that when it is not enabled, its output is connected to ground. Hence, when gate 14 is inhibited, resistors 16 and 51 are grounded by that gate.

Preferably, comparator 7 is a Schmitt trigger circuit because of its simplicity and because of its hysteresis. By hysteresis it is meant that the comparator will "fire," that is, emit an enabling signal to gate 14, when the output of amplifier 4 equals or is greater than the voltage impressed at terminal 18, and that to cause the comparator to cease emitting the enabling signal, the output of amplifier 4 must fall to some level below the level necessary to "fire" the comparator. For example, where the output of amplifier 4 required to "fire" the comparator is one volt, the amplifier's output may be required to drop to half a volt in order to cause the comparator to return to its original state. The comparator is then said to have a hysteresis of half a volt.

The output of differential amplifier 50 is connected through resistor 53 to summing junction 3. As a means for clamping the output of amplifier 50, there is provided, back to back, a Zener diode pair 54 which connects the output of the differential amplifier to ground so that the output of that amplifier cannot rise above or drop below the voltage level set by the Zener diodes. The Zener diodes limit the output of amplifier 50 to ½ the full scale voltage of the analog-to-digital converter of FIG. 4. For the purpose of exposition, the full scale voltage of the analog-to-digital comparator of FIG. 4 is assumed to be 1 volt.

Assuming comparator 7 to be in the state where gate 14 is inhibited so that resistors 16 and 51 are connected to ground, if now a positive going ramp voltage 55 is applied to input terminal 1, as that voltage rises, the output $E_o$ of the differential amplifier will go negative until it reaches ½ the full scale voltage, i.e. −½ volt, at which time Zener diodes 54 prevent any further change in $E_o$. The signal from the output of differential amplifier 50 is fed back through resistor 53 to summing junction 3. For this discussion it may be noted that resistors 2 and 53 are equal in value. If the ramp voltage 55 exceeds the ½ scale voltage, summing junction 3 is not maintained at a virtual ground and the output of amplifier 4 will rise to a level that will fire comparator 7. When the "firing" level is reached, comparator 7 emits an enabling signal to gate 14 causing voltage $V_f$ at terminal 15 to be applied to resistors 16 and 51. Upon the enabling of gate 14, the voltage applied to resistor 51 forces the output $E_o$ of the differential amplifier to fall toward zero and simultaneously a signal is fed through resistor 16 to summing junction 3. If the maximum rise of the ramp voltage is only slightly higher than the ½ full scale voltage, then the feedback signals cause $E_o$ to become positive by nearly ½ the full scale voltage. That is, the output $E_o$ changes, when comparator 7 fires, from a negative ½ full scale voltage to a positive voltage of nearly ½ the full scale value. The output of amplifier 4, consequently drops by nearly ½ full scale voltage. In order that comparator 7 shall not inhibit gate 14 at this time, the comparator should have at least ½ volt of hysteresis. It should be noted that the reference signal at terminal 18 of comparator 7 need not be exactly 1 volt as its operation is not greatly affected so long as the reference voltage is greater than half a volt, if the voltage applied through resistor 51 is equal to full scale.

It is readily apparent that the arrangement of FIG. 3 can be easily modified to determine whether the value of the signal at terminal 1 is less than or greater than any arbitrary value. As an example, consider the modified arrangement of the present invention depicted in FIG. 5. One input to comparator 10 is obtained from the output of amplifier 4. The other input to the comparator is obtained from the summing junction 32 of a resistive network comprising resistors $R_1$, $R_2$, $R_4$, $R_8$, and $R_0$. Resistor $R_0$ is connected between ground and the summing junction 32 whereby the voltage across resistor $R_0$ constitutes the other input to the comparator. Resistor $R_1$ is connected between the summing junction and a voltage source $E_c$. Resistor $R_2$, $R_4$, and $R_8$ are each, at one end, connected by its own gate, 26, 28, or 14 to voltage source $E_1$, $E_2$, and $E_3$, respectively, the other end of each resistor being joined to the summing junction. The outputs of gates 26, 28, and 14 are $E_1$, $E_2$ and $E_3$ when enabled. Gates 26, 28, and 14 are constructed to cause their outputs to be grounded when the gate is not enabled. The voltage sources $E_c$, $E_1$, $E_2$, $E_3$ and the values of resistors $R_1$, $R_2$, $R_4$, and $R_8$ are so related that when gate 26 is open (i.e., the gate is enabled), the current through $R_2$ is twice as large as the current flowing through $R_1$, when gate 28 is open the current through $R_4$ is four times as large as the current flowing through $R_1$, and when gate 14 is open the current through resistor $R_8$ is eight times larger than the current flowing through resistor $R_1$. The currents flowing through resistors $R_1$, $R_2$, $R_4$, and $R_8$ are in the same direction so as to be additive. That is, assuming the input to comparator 10 from the summing junction must be of positive polarity, voltages $E_c$, $E_1$, and $E_2$ are positive with respect to ground so that currents flow through resistors $R_1$, $R_2$, $R_4$, and $R_8$ toward the summing junction and thence through resistor $R_0$ to ground.

Figure 5:
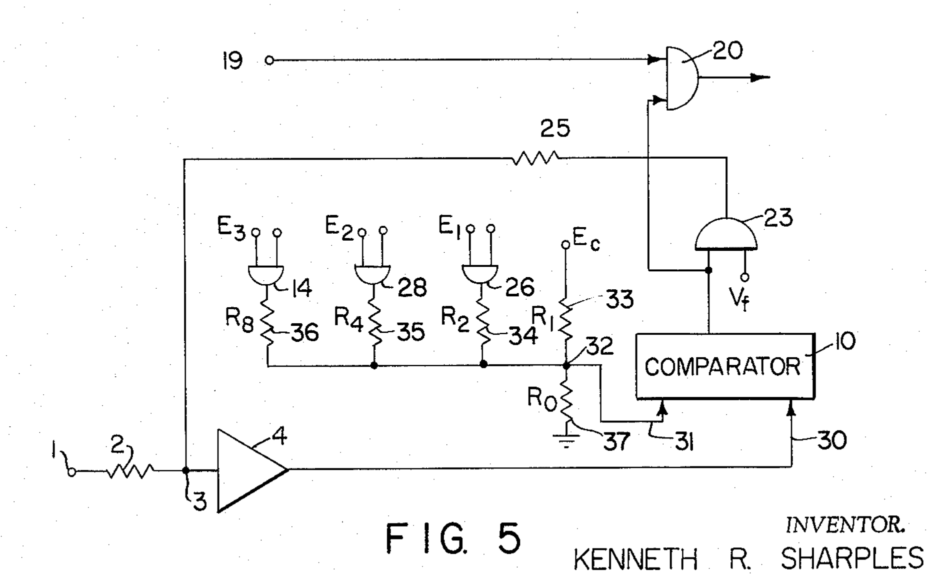
FIG. 5 shows an elaboration upon the simple converter of FIG. 3.

It is assumed that the initial condition of the FIG. 5 arrangement is that gates 14, 28, and 26 are closed (i.e., inhibited) causing sources $E_1$, $E_2$, $E_3$ to be isolated, and that the current through $R_1$ and $R_0$ is of such magnitude as to require a 1 volt input at terminal 1 before comparator 10 provides an enabling input to gate 23. When gate 26 is opened, current flows through $R_2$ to the summing junction. The increase of current contributed by resistor $R_2$, increases the voltage drop across resistor $R_0$ so that a 3 volt input at terminal 1 is required to cause the comparator to provide an enabling output. If gate 26 is then closed and gate 28 is opened, the current contributed by resistor $R_4$ increases the voltage drop across resistor $R_0$ so that a 5 volt input at terminal 1 is required to cause the comparator to provide an enabling output. If gate 28 is then closed and gate 14 is opened, the current contributed by resistor $R_8$ increases the voltage drop across resistor $R_0$ so that a 9 volt input at terminal 1 is required to cause comparator 10 to emit an enabling signal. With gates 26, 28, and 14 open, the current flow through resistors $R_1$, $R_2$, $R_4$, and $R_8$ is such that the input analog signal must attain at least fifteen volts in order to cause comparator 10 to furnish an enabling signal to gate 23.

By selectively controlling gates 14, 28, and 26, comparator 10 may be caused to decide whether the input analog voltage is less than or greater than 1 volt, 3 volts, 5 volts, 7 volts, 9 volts, 11 volts, 13 volts, or 15 volts. Where the input analog voltage is equal to or greater than the selected comparison voltage, gate 23 is enabled by the output signal of comparator 10 and the reference signal is fed through resistor 25 to summing junction 3 of amplifier 4. When the signal current through resistor 25 is sufficient to bring junction 3 to a virtual ground, the output of amplifier 4 remains constant, that is, the output of amplifier 4 neither increases nor decreases. Where the signal current through resistor 25 is less than or greater than the current through input resistor 2, the output of amplifier 4 increases in the first case and decreases in the second case, since the signal fed through resistor 25 to the amplifier's summing junction is not sufficient to maintain a virtual ground. The comparison to be accurate, must upon the enabling of gate 23, cause the signal through resistor 25 to be of such magnitude as to bring summing junction 3 to virtual ground. Therefore, either the value of resistor 25 or the magnitude of voltage $V_f$ would have to be changed in the arrangement of FIG. 6 each time a different combination of resistors $R_1$, $R_2$, $R_4$, and $R_8$ was used in order to bring the summing junction to virtual ground.

Figure 6:
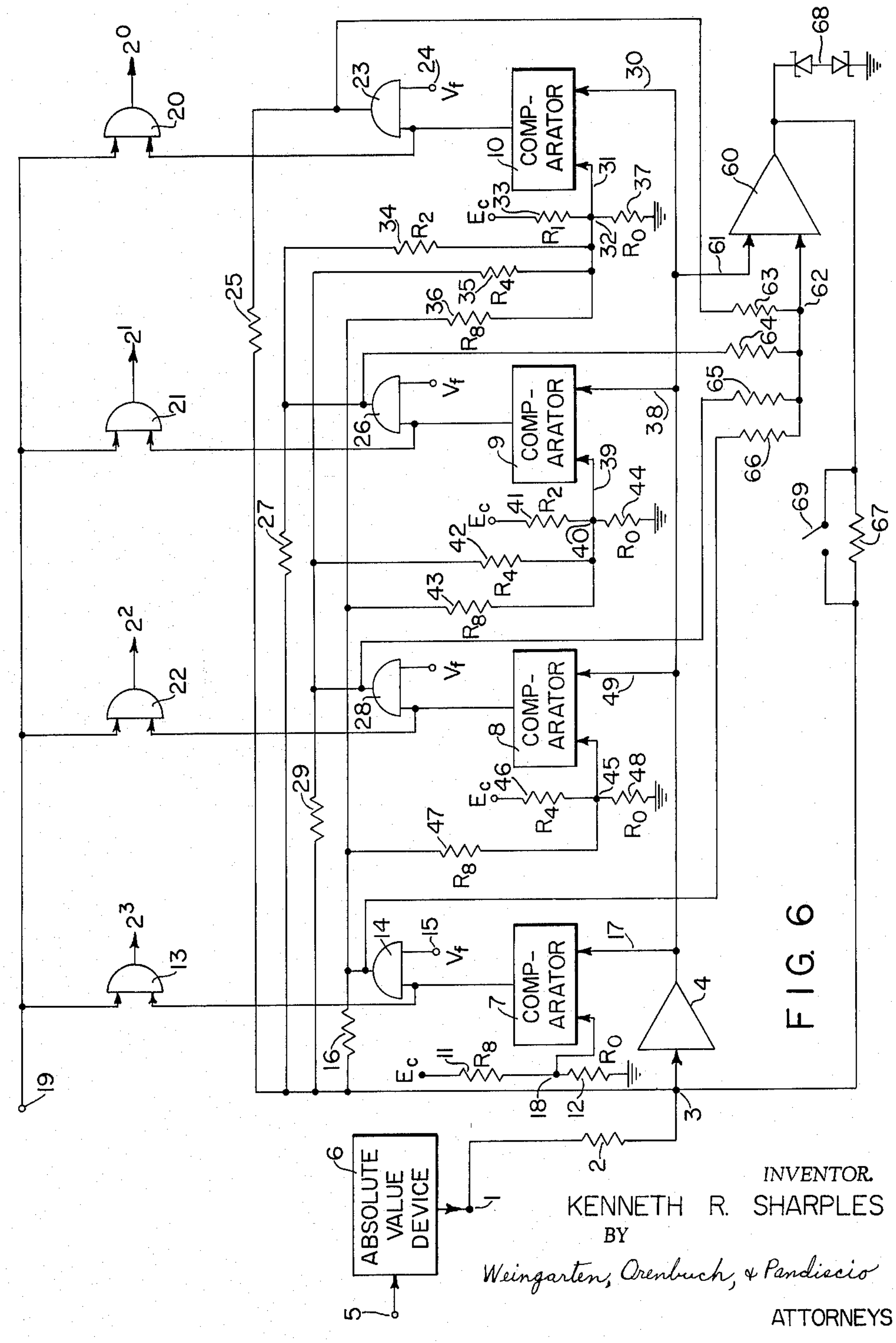
FIG. 6 depicts diagrammatically the arrangement of the preferred embodiment of the invention.

Referring now to FIG. 6, there is shown the schematic arrangement of the preferred embodiment of the invention.

The structure shown in FIG. 3 constitutes a part of the arrangement depicted in FIG. 6, identical reference numerals having been used in both those figures to identify corresponding elements. Similarly, the structure shown in FIG. 5 constitutes a part of the arrangement depicted in FIG. 6, identical reference numerals having been used in both those figures to identify corresponding elements. The voltages $E_1$, $E_2$, $E_3$ in FIG. 6 correspond to the voltage $V_f$ applied in FIG. 5 to gates 14, 28, and 26.

For purposes of exposition, it is assumed that the embodiment of FIG. 6 is intended to convert the input analog voltage impressed at terminal 1 into its equivalent value expressed in the standard binary code and that the full scale voltage of the device is fifteen volts. The input analog signal is impressed at terminal 1 and is applied through resistor 2 to the summing junction 3 of a high gain D.C. amplifier 4. The amplifier 4 need not be a signal inverting device. The input analog signal impressed at terminal 1, for proper operation of the preferred embodiment of the invention, must be a unipolar signal, that is, the signal at terminal 1 must be positive in polarity or negative in polarity, but must not be allowed to change from one polarity to another. Where the analog signal is bipolar, that signal can be made unipolar by applying it at terminal 5 to the input of an absolute value device 6. The absolute value device by way of example, may be of the type shown in U.S. Patent No. 2,997,660, issued August 22, 1961 to F. M. Young or of the type shown on page 143 of Principle of Analog Computation by G. W. Smith and R. C. Wood, published by McGraw-Hill, 1959 edition. For purposes of exposition, it is assumed that the signal impressed at terminal 1 is of negative polarity.

For best performance, D.C. amplifier 4 should be stabilized to prevent its output voltage from changing from one value to another value during an extended period in which an unchanging signal is applied to that amplifier's input. That is, amplifier 4 should be stabilized against drift. Many schemes for stabilizing D.C. amplifiers are known, some of the more widely used schemes being discussed in Principles of Analog Computation (pages 218–223) and in the chapter entitled "Computing Amplifiers" in the book Analog and Digital Computer Technology by Norman R. Scott, published by McGraw-Hill, 1960 edition.

The output of amplifier 4 is applied to voltage comparators 7, 8, 9 and 10. In each of those comparators, the amplifier's output voltage is compared against a digitally weighted reference voltage.

The converter binarily encoded output is obtained from AND gates 13, 22, 21 and 20, the most significant bit in the code being obtained from the output of gate 13, and the next most significant bit being obtained from gate 22, and so forth in descending order, the least significant bit being provided by gate 20. One input of each of gates 13, 22, 21, 20 is connected to a corresponding one of comparators 7, 8, 9, 10. The output binary code is obtained in parallel form by applying an enabling pulse to terminal 19. Any of gates 13, 22, 21, 20 having both inputs enabled provides a ONE output; those gates having only one input enabled, provide a ZERO output. In standard binary code, the "weight" attached to the output of gate 20 is $2^0$, the "weight" attached to the output of gate 21 is $2^1$, the "weight" attached to the output of gate 22 is $2^2$, and the "weight" attached to the output of gate 13 is $2^3$.

AND gates 14, 28, 26, and 23 are each constructed so that when the gate is inhibited, i.e., not enabled, the output of the gate is held at ground potential. AND gate 23 is coupled to the output of comparator 10, in a manner such that when comparator 10 emits an enabling signal to gate 20, that signal also enables gate 23 to pass the voltage $V_f$ applied at terminal 24 to its output. Upon the enabling of gate 23, therefore, a signal is fed through resistor 25 to the summing junction 3 of amplifier 4. In like manner, AND gate 26 causes a signal to be fed through resistor 27 to summing junction 3 when an enabling signal is emitted by comparator 9. AND gate 28, similarly, causes a signal to be fed through resistor 29 to summing junction 3 when comparator 8 emits an enabling signal.

Comparator 7 obtains its reference voltage from a voltage divider consisting of resistors 11 and 12 across which a constant voltage $E_c$ is impressed. When the output voltage of amplifier 4 exceeds the reference voltage applied to comparator 7, the comparator emits an enabling signal to AND gates 13, 14. Upon being enabled, AND gate 14 permits the voltage $V_f$ impressed at its terminal 15 to be transmitted through that gate and the output of AND gate 14 is coupled by resistor 16 to summing junction 3.

As a matter of convenience, the same voltage $V_f$ is impressed on the inputs of gates 14, 28, 26, 23 and appears at the outputs of those gates whenever the gates are enabled by their respective comparators. The value of resistor 25 is selected to cause the signal fed through it to summing junction 3 to maintain that junction at virtual ground when a 1 volt signal is impressed at input terminal 1 and gates 14, 28, and 26 are inhibited. The value of resistor 27 is selected to cause the signal fed by it to the summing junction 3 to maintain that junction at virtual ground when a 2 volt signal is impressed at terminal 1 and gates 14, 28, and 23 are inhibited. Resistor 29 is of such value as to maintain summing junction 3 at virtual ground when a four volt signal is impressed at terminal 1 and gates 15, 26, and 24 are inhibited. Resistor 16 is of such value as to cause summing junction 3 to be at virtual ground when an eight volt signal is impressed at terminal 1 and gates 28, 26, and 23 are inhibited.

Comparator 10 has one input 30 coupled to the output of amplifier 4. The other input 31 of comparator 10 is coupled to the summing junction 32 of the network formed by resistors 33, 34, 35, 36, and 37. Comparator 9 has its input 38 connected to the output of amplifier 4 and its input 39 coupled to the summing junction 40 of the network consisting of resistors 41, 42, 43, and 44. Comparator 8 is arranged to compare the output of amplifier 4 with the potential at the summing junction 45 of the network formed by resistors 46, 47, and 48. As previously discussed in connection with FIG. 3, comparator 7 compares the potential at junction 18 with the output potential of amplifier 4 which appears at its input 17.

Resistors 16, 47, 43, and 36 are connected to the output of gate 14. When gate 14 is energized by an enabling signal from comparator 7, each of the resistors connected to the gate's output contributes a current to its respective summing junction. Similarly, resistors 29, 42, and 35 are connected to the output of gate 28 so as to contribute their currents when gate 28 is enabled by comparator 8; and resistors 27 and 34 are connected to the output of gate 26 so as to contribute their currents to their respective summing junctions when gate 26 is enabled by comparator 9.

A voltage $E_c$, impressed across resistors 33 and 37, establishes a minimum potential at summing junction 32 such that an analog signal of one volt at input terminal 30 is required to cause comparator 10 to provide an enabling output. In the absence of an enabling output, comparator 10 causes gates 23 and 20 to be inhibited. The voltage $E_c$ is impressed across resistors 41 and 44 to establish a minimum potential at summing junction 40 such that an analog input signal of two volts is required to cause comparator 9 to emit an enabling signal. In the absence of an enabling signal, comparator 9 causes gates 26 and 21 to be inhibited. The minimum potential at summing junction 45, established by the voltage $E_c$ impressed across resistors 46 and 48, is such as to require an analog input signal of four volts, applied at terminal 1, to cause comparator 8 to emit an enabling signal to gates 28 and 22. As previously discussed, comparator 7 obtains its reference voltage from the voltage divider 11, 12 across which the voltage $E_c$ is impressed. The potential at junction 18 is such as to require an analog input signal of eight volts to cause comparator 7 to enable gates 13 and 14.

*Operation*

The initial condition of the device depicted in FIG. 6 is assumed to be that gates 14, 28, 26, and 23 are inhibited by their respective comparators and that an analog signal of 10 volts is impressed at input terminal 1. Upon the impress of the analog signal, the output of amplifier 4 commences to rise toward a higher potential. As that amplifier output rises, it reaches a level sufficient in comparison to the signal at summing junction 32 to cause comparator 10 to enable gate 23 whereupon a signal is fed through resistor 25 to summing junction 3 tending to slow the rise in potential at the output of amplifier 4. The output of amplifier 4, however, continues to rise, and attains a level sufficient in comparison to the signal at summing junction 40 to cause comparator 9 to enable gate 26 whereupon a signal is applied through resistor 27 to summing junction 3 tending to slow the rise in output voltage of amplifier 4. At the same time, a signal is fed through resistor 34 to junction 32, raising the potential at that junction to a level causing comparator 10 to inhibit gate 23. Shortly thereafter, the rising output of amplifier 4 causes comparator 10 to again enable gate 23. The output of amplifier 4 continues to rise, attaining a level sufficient in comparison to the signal at summing junction 45 to cause comparator 8 to enable gate 28. Upon being enabled, gate 28 causes a signal to be applied through resistor 29 to summing junction 3 and through resistors 42 and 35 to their respective summing junction, 40 and 32. The currents flowing through resistors 42 and 35 cause comparators 9 and 10 to disable gates 26 and 23. The signal fed through resistor 29 to junction 3 is insufficient to stabilize amplifier 4, and the amplifier's output voltage continues to rise. As a result, comparators 9 and 10 again enable gates 23 and 26. With gates 28, 26 and 23 enabled, signals are fed through resistors 29, 27 and 25 to summing junction 3. Those combined signals are insufficient to bring the summing junction to virtual ground and, therefore, the output of amplifier 4 rises to a level where it is sufficient in comparison to the voltage at junction 18 to cause comparator 7 to enable gate 14. The enabling of gate 14 makes currents flow in resistors 47, 43 and 36 which cause comparators 8, 9 and 10 to disable their respective gates 28, 26 and 23. Simultaneously, a signal is fed through resistor 16 of such magnitude as to have brought junction 3 to virtual ground had the input analog signal been eight volts. Since the assumed input analog signal is ten volts, the output of amplifier 4 continues to rise to a level where comparator 10 again enables gate 23. Upon the enabling of gate 23, the signal applied through resistor 25 to junction 3 is added to the signal applied to that junction through resistor 16 and is of such magnitude as to have brought junction 3 to virtual ground had the input analog signal been nine volts. As the input analog signal is larger than nine volts, the output of amplifier 4 rises until comparator 9 enables gate 26. Upon that gate being enabled, a current is made to flow in resistor 34, which, added to the currents in resistors 33 and 36, raises the potential at junction 36 to a level causing comparator 10 to disable gate 23. The enabling of gate 26, simultaneously, also causes a signal to be fed through resistor 27 to junction 3 where it is added to the signal applied through resistor 16. Those combined signals cause junction 3 to be brought to virtual ground whereupon the output of amplifier 4 ceases to rise and maintains a constant level.

The state of the device is, then, that gates 14 and 26 are enabled, gates 28 and 23 are disabled, summing junction 3 is at virtual ground, and the output of amplifier 4 is constant. Since gates 14 and 26 are enabled, gates 13 and 21 are also enabled. As a corollary, since gates 28 and 23 are inhibited, gates 22 and 20 are inhibited. Consequently, a readout pulse applied at terminal 19 will cause a pulse signal to appear at the output of gate 13 and gate 21 whereas no pulse will appear at the output of gates 22 and 20. The appearance of an output signal is here assumed to signify a ONE in binary notation and the absence of an output signal is taken to signify a ZERO. Therefore, the code obtained from gates 13, 22, 21 and 20, reading the gates from left to right is 1010. In standard binary code, 1010 is equivalent to the decimal number 10. Thus, the analog signal of 10 volts is converted by the device of FIG. 1 to its equivalent value in the binary code.

In order to prevent the device of FIG. 6 from "hunting," that is, from causing the digital count to fluctuate whenever the analog signal changed slightly, a differential amplifier 60 is provided. The differential amplifier has one input 61 coupled to the output of amplifier 4. The other input of the differential amplifier is connected to a summing junction 62. Resistors 63, 64, 65 and 66 connect the summing junction 62 to the output of gates 23, 26, 28 and 14, respectively. The output of differential amplifier 60 is connected through resistor 67 to summing junction 3.

The purpose of differential amplifier 60 is to require the analog signal to change by an amount at least equal to one-half the value of the least significant digit of the converter in order for the change to have an effect upon the digital count. To achieve that purpose, the output of the differential amplifier is clamped by a back to back pair of Zener diodes 68 which prevents the amplifier's output from going, either positive or negative, by an amount exceeding one-half the value of the least significant digit. That is, the maximum signal which the amplifier 60 is permitted to transmit through resistor 67 to summing junction 3, is a signal whose value is equivalent to one half the value of the converter's least significant digit.

Resistors 63, 64, 65 and 66 have values such that when only gate 23 is enabled, the signal applied through resistor 63 to summing junction 62 is equivalent to the value of the least significant digit; when only gate 26 is enabled, the signal applied through resistor 64 to junction 62 is equivalent to the value of the next more significant digit; when only gate 28 is enabled, the signal applied through resistor 65 to junction 62 is equivalent to the value of the next more significant digit; and when only gate 14 is enabled, the signal applied through resistor 66 to junction 62 is equivalent to the value of the most significant digit. Of course, the signals applied through resistors 63, 64, 65, 66 are additive at the summing junction.

From the foregoing description it should be apparent that when the reference voltage at summing junction 32 of comparator 10 changes due to the enabling or inhibiting of gates 26, 28 and 14, a corresponding change occurs in the voltage at summing junction 62 of differential amplifier 60.

In comparing the rudimentary converter of FIG. 4 with the more developed converter of FIG. 6, it can be seen that differential amplifier 50 of FIG. 4 corresponds to amplifier 60 of FIG. 6, that resistor 51 of FIG. 4 corresponds to resistor 63 of FIG. 6, that resistor 53 of FIG. 4 corresponds to resistor 67 of FIG. 6, and that Zener diode pair 54 of FIG. 4 corresponds to Zener diode pair 68 of FIG. 6. The operation of differential amplifier 60 in the arrangement of FIG. 6 is similar to the previously described operation of differential amplifier 50 in the arrangement of FIG. 4.

In FIG. 6 a switch 69 is depicted which shunts resistor 67. Closing switch 69 causes the converter to hold the digital count which it had at the moment the switch was closed. Any subsequent change in the analog signal applied at terminal 1 has no effect upon the digital count of the converter. When the switch is opened, normal operation of the converter is resumed.

While a preferred embodiment of the invention has been described, modifications can be made, and indeed are apparent to those knowledgeable in the converter art, which do not materially depart from the essential inventive concepts. For example, the number of comparator stages in the embodiment of FIG. 6 may be increased or decreased to yield the desired number of digits. Assuming a six digit code is required, the number of comparator stages in the embodiment of FIG. 6 would be increased by two. That alteration would necessarily entail additional output gates and additional resistors in the various summation networks.

Another adaption of the invention which is deemed to be obvious is to connect in cascade a number of units similar to that shown in FIG. 6. Where such units are connected in cascade, only the last unit in line need have the differential amplifier 60 and the output of that amplifier preferably would be fed back to the summing junction of the high gain amplifier of the first unit. In the cascaded arrangement, the output signal of one unit would, preferably, be amplified before being transmitted to the next unit in line.

In view of the modification and adaptations which can be made, it is intended that the invention not be limited by the embodiments illustrated herein, but rather that the scope of the invention be construed in accordance with the appended claims.

What is claimed is:

1. An analog to digital converter comprising an amplifier having an input summing junction, means for applying the analog signal to the amplifier's summing junction, a plurality of comparators coupled to the output of the amplifier, each comparator residing in one or the other of two stable states, each comparator being connected to compare the output of the amplifier with a digitally weighted reference voltage, and means controlled by each comparator for applying a digitally weighted signal to the amplifier's summing junction to cause that junction to be maintained at virtual ground.

2. An electronic device for converting an analog signal to a set of digital signals equivalent in value to the analog signal, the converting device comprising:

a high gain amplifier having an input summing junction;

means for applying the analog signal to the input summing junction of the amplifier;

a plurality of comparators, each comparator having applied to it a digitally weighted reference voltage for comparison with the output of the amplifier, the comparator emitting an enabling signal upon the attainment of substantial equality of the compared signals;

a corresponding plurality of means for applying digitally weighted signals to the input summing junction of the amplifier, the digitally weighted signals being additive and tending to maintain that junction at virtual ground, each of the means being controlled by a corresponding comparator;

and a plurality of output gates for supplying the set of digital signals, each gate providing a different signal of the set and being responsive to the enabling signal from a corresponding comparator.

3. An electronic device for converting an analog signal to a digital code equivalent in value to the analog signal, the converting device comprising:

a high gain amplifier having an input summing junction;

means for applying the analog signal to the input summing junction;

a comparator associated with the least significant digit of the code, the comparator being connected to compare the output of the amplifier with a reference voltage;

a signal source controlled by the comparator, the comparator, upon the attainment of equality of the compared signals, causing the signal source to apply a digitally weighted signal to the summing junction, the digitally weighted signal tending to bring the summing junction to virtual ground;

a differential amplifier having one input derived from the output of the high gain amplifier and its other input derived from the aforesaid signal source, the differential amplifier having its output coupled to the summing junction;

and means connected to the output of the differential amplifier for limiting the signal transmitted to the summing junction to one half the value of the least significant digit of the set.

4. An electronic device for converting an analog signal to a set of digital signals equivalent in value to the analog signal, the converting device comprising:

a high gain amplifier having an input summing junction;

means for applying the analog signal to the summing junction of the amplifier;

a plurality of comparators, each comparator being associated with a different digit of the set, each comparator being connected to compare the output of the amplifier with a digitally weighted reference voltage, the comparator emitting an enabling signal upon the attainment of substantial equality of the compared signals;

means responsive to the enabling signal of a comparator of higher digital significance for emitting a signal causing a digitally weighted increase in the reference voltage of each comparator of lesser digital significance and causing a digitally weighted signal to be applied to the summing junction of the amplifier tending to maintain the junction at virtual ground;

means responsive to the enabling signal of the comparator of least digital significance for causing a digitally weighted signal to be applied to the summing junction of the amplifier tending to maintain the junction at virtual ground;

and a plurality of output gates for supplying the set of digital signals, each gate providing a different signal of the set and being responsive to the enabling signal from the comparator associated with the same digit of the set.

5. An electronic device for converting an analog signal to a set of digital signals equivalent in value to the analog signal, the converting device comprising:

a high gain amplifier having an input summing junction;

means for applying the analog signal to the summing junction of the amplifier;

a plurality of comparators, each comparator being associated with a different digit of the set, each comparator being connected to compare the output of the amplifier with a digitally weighted reference voltage, the comparator emitting an enabling signal upon the attainment of substantial equality of the compared signals;

means responsive to the enabling signal of a comparator of higher digital significance for emitting a signal causing a digitally weighted increase in the reference voltage of each comparator of lesser digital significance and causing a digitally weighted signal to be applied to the summing junction of the amplifier tending to maintain the junction at virtual ground;

means responsive to the enabling signal of the comparator of least digital significance for causing a digitally weighted signal to be applied to the summing junction of the amplifier tending to maintain the junction at virtual ground;

means for preventing the comparator of least digital significance from responding to a change in the analog signal which is less than one half the value of the least significant digit;

and a plurality of output gates for supplying the set of digital signals, each gate providing a different signal of the set and being responsive to the enabling signal from the comparator associated with the same digit of the set.

6. An electronic device for converting an analog signal to a set of digital signals equivalent in value to the analog signal, the converting device comprising:

a high gain amplifier having an input summing junction;

means for applying the analog signal to the summing junction of the amplifier;

a plurality of comparators, each comparator being associated with a different digit of the set, each comparator being connected to compare the output of the amplifier with a digitally weighted reference voltage, the comparator emitting an enabling signal upon the attainment of substantial equality of the compared signals;

means responsive to the enabling signal of a comparator of higher digital significance for emitting a signal causing a digitally weighted increase in the reference voltage of each comparator of lesser digital significance and causing a digitally weighted signal to be applied to the summing junction of the amplifier tending to maintain the junction at virtual ground;

means responsive to the enabling signal of the comparator of least digital significance for causing a digitally weighted signal to be applied to the summing junction of the amplifier tending to maintain the junction at virtual ground;

a differential amplifier having its output coupled by an impeder to the summing junction, the differential amplifier having its inputs connected to act upon the difference between the output of the high gain amplifier and a signal related in value to the signals tending to maintain the junction at virtual ground;

means connected to the output of the differential amplifier for limiting the signal coupled through the impeder to the summing junction to one half the value of the least significant digit of the set;

and a plurality of output gates for supplying the set of digital signals, each gate providing a different signal of the set and being responsive to the enabling signal from the comparator associated with the same digit of the set.

7. An electronic device for converting an analog signal to a set of digital signals equivalent in value to the analog signal, the converting device comprising:

a high gain amplifier having an input summing junction;

means for applying the analog signal to the summing junction of the amplifier;

a plurality of comparators, each comparator being associated with a different digit of the set, each comparator being connected to compare the output of the amplifier with a digitally weighted reference voltage, the comparator emitting an enabling signal upon the attainment of substantial equality of the compared signals;

means responsive to the enabling signal of a comparator of higher digital significance for emitting a signal causing a digitally weighted increase in the reference voltage of each comparator of lesser digital significance and causing a digitally weighted signal to be applied to the summing junction of the amplifier tending to maintain the junction at virtual ground;

means responsive to the enabling signal of the comparator of least digital significance for causing a digitally weighted signal to be applied to the summing junction of the amplifier tending to maintain the junction at virtual ground;

a differential amplifier having its output coupled by an impeder to the summing junction, the differential amplifier having its inputs connected to act upon the difference between the output of the high gain amplifier and a signal related in value to the signals tending to maintain the junction at virtual ground;

means connected to the output of the differential amplifier for limiting the signal coupled through the impeder to the summing junction to one half the value of the least significant digit of the set;

a switch shunting the impeder for causing the set of digital signals to be held unchanged when the switch is closed;

and a plurality of output gates for supplying the set of digital signals, each gate providing a different signal of the set and being responsive to the enabling signal from the comparator associated with the same digit of the set.

8. A device for converting an analog signal to a set of digital signals equivalent in value to the analog signal, the converting device comprising: summing means having an input and an output, said summing means providing on its output a signal equal to the algebraic summation of signals applied to its input; means for applying the analog signal to the input of said summing means; a plurality of comparators, each comparator being associated with a different digit of the set, each comparator being connected to compare the output of said summing means with a digitally weighted reference signal, the comparator emitting an enabling signal upon the attainment of substantial equality of the compared signals; means responsive to the enabling signal of a comparator of higher digital significance for emitting a signal causing a digitally weighted increase in the reference signal of each comparator of lesser digital significance and causing a digitally weighted signal to be applied to the input of said summing means tending to maintain the output of said summing means at substantially zero and a plurality of gates for supplying the set of digital signals, each gate providing a different signal of the set and being responsive to the enabling of signal from the comparator associated with the same digit of the set.

9. Apparatus in accordance with claim 8 and including means responsive to the enabling signal of the comparator of least digital significance for causing a digitally weighted signal to be applied to the input of said summing means tending to maintain the output of said summing means at substantially zero.

10. Apparatus in accordance with claim 9 and including means for preventing the comparator of least digital significance from responding to a change in the analog signal which is less than a predetermined fraction of the value of the least significant digit.

References Cited by the Examiner

UNITED STATES PATENTS

| | | | |
|---|---|---|---|
| 2,997,704 | 4/1961 | Gordon et al. | |
| 3,046,543 | 7/1962 | Kaenel | 340—347 |
| 3,100,298 | 8/1963 | Fluhr | 340—347 |

MALCOLM A. MORRISON, *Primary Examiner.*

K. R. STEVENS, *Assistant Examiner.*